United States Patent
Harada

(10) Patent No.: US 8,884,315 B2
(45) Date of Patent: Nov. 11, 2014

(54) SEMICONDUCTOR LIGHT EMITTING DEVICE AND METHOD OF MANUFACTURING THE SAME

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 1366 days.

(21) Appl. No.: 11/102,929

(22) Filed: Apr. 11, 2005

(65) Prior Publication Data

US 2005/0253153 A1 Nov. 17, 2005

(30) Foreign Application Priority Data

Apr. 23, 2004 (JP) .................................. 2004-128152

(51) Int. Cl.
| | | |
|---|---|---|
| *H01L 33/00* | (2010.01) | |
| *H01L 33/64* | (2010.01) | |
| *H01L 33/50* | (2010.01) | |
| *H01L 33/48* | (2010.01) | |
| *H01L 23/00* | (2006.01) | |

(52) U.S. Cl.
CPC ..... *H01L 33/507* (2013.01); *H01L 2924/19107* (2013.01); *H01L 33/644* (2013.01); *H01L 24/45* (2013.01); *H01L 33/486* (2013.01); *H01L 2224/45147* (2013.01); *H01L 2224/48091* (2013.01); *H01L 2224/45124* (2013.01); *H01L 2224/45144* (2013.01)
USPC .......................................................... 257/89

(58) Field of Classification Search
USPC ..................... 257/89; 385/122, 129
See application file for complete search history.

(56) References Cited

U.S. PATENT DOCUMENTS

| | | | | |
|---|---|---|---|---|
| 5,834,893 | A | * 11/1998 | Bulovic et al. | 313/506 |
| 5,959,316 | A | 9/1999 | Lowery | 257/98 |
| 6,066,861 | A | 5/2000 | Hohn et al. | 257/99 |
| 6,245,259 | B1 | 6/2001 | Hohn et al. | 252/301.36 |
| 6,277,301 | B1 | 8/2001 | Hohn et al. | 252/301.36 |
| 6,294,800 | B1 * | 9/2001 | Duggal et al. | 257/89 |
| 6,576,930 | B2 | 6/2003 | Reeh et al. | 257/98 |
| 6,576,931 | B2 | 6/2003 | Furukawa et al. | |
| 6,592,780 | B2 | 7/2003 | Hohn et al. | 252/301.36 |
| 6,613,247 | B1 | 9/2003 | Hohn et al. | 252/301.36 |
| 6,669,866 | B1 | 12/2003 | Kummer et al. | 252/301.4 R |
| 6,774,401 | B2 | 8/2004 | Nakada et al. | 257/82 |
| 6,809,342 | B2 | 10/2004 | Harada | 257/79 |
| 6,812,500 | B2 | 11/2004 | Reeh et al. | 257/98 |
| 6,819,845 | B2 * | 11/2004 | Lee et al. | 385/122 |
| 6,936,857 | B2 * | 8/2005 | Doxsee et al. | 257/89 |
| 7,020,372 | B2 * | 3/2006 | Lee et al. | 385/129 |

FOREIGN PATENT DOCUMENTS

| | | |
|---|---|---|
| EP | 1 178 544 A2 | 2/2002 |
| EP | 1 681 728 A1 | 7/2006 |
| JP | 10-190065 | 12/1996 |
| JP | 10-107322 A | 4/1998 |
| JP | 2001-127346 | 10/1999 |

(Continued)

OTHER PUBLICATIONS

Relevant portion of European Patent Search Report for corresponding European Patent Application No. 05008294.0.

*Primary Examiner* — Nathan Ha
(74) *Attorney, Agent, or Firm* — Keneally Vaidya LLP

(57) ABSTRACT

A semiconductor light emitting device can include a base having a cavity provided for housing an LED chip and a resin spacer therein. The resin spacer can be composed of at least two layers of spacers including a transparent resin spacer and a wavelength conversion spacer mixed with a fluorescent material and formed to have an almost constant thickness. The wavelength conversion spacer can include a metallic radiation mesh or radiation wire disposed therein.

16 Claims, 2 Drawing Sheets

(56) References Cited

FOREIGN PATENT DOCUMENTS

| JP | 2001-196639 | 1/2000 |
|----|-------------|--------|
| JP | 2001-210872 | 1/2000 |
| JP | 2000-077723 | 3/2000 |
| JP | 2001-345483 | 5/2000 |
| JP | 2001-036148 A | 2/2001 |
| JP | 2004-056075 | 12/2002 |
| WO | WO02/056390 A1 | 7/2002 |

* cited by examiner

SEMICONDUCTOR LIGHT EMITTING DEVICE AND METHOD OF MANUFACTURING THE SAME

This application claims the priority benefit under 35 U.S.C. §119 of Japanese Patent Application No. 2004-128152 filed on Apr. 23, 2004, which is hereby incorporated by reference.

BACKGROUND OF THE INVENTION

1. Field of the Invention

The invention relates to an LED lamp and method of manufacture, and more particularly to a structure of the so-called white LED lamp that includes an LED chip capable of emitting a blue light. A fluorescent material can be disposed on or adjacent to an optical path of the light emitted from the LED chip to emit a yellow light when excited by the blue light. The blue light from the LED chip and the yellow light from the fluorescent material can be mixed to yield a white light, which can then be externally emitted.

2. Description of the Related Art

An LED chip capable of emitting a blue light, and a fluorescent material that is operative to emit a yellow light when excited by the blue light from the LED chip, are employed in the art to yield a white light. In this case, the LED chip is die-mounted in a recessed cavity provided in a base, followed by necessary wiring of gold wires, for example. Then, it is molded in a transparent resin with a certain depth to form a transparent spacer. Further, a resin that contains a fluorescent material uniformly dispersed therein is poured with a uniform thickness onto the transparent spacer to form a second layer that contains the fluorescent material in an appropriate direction.

Thus, the blue light emitted from the LED chip, though it may advance in any direction, transmits through the second layer which has an almost uniform thickness. Therefore, substantially all portions of the second layer have almost similar ratios in the amount of light which transmits through the second layer as the blue light as compared to the amount of light which is converted at the second layer into a yellow light. Accordingly, the entire surface of the second layer can be viewed as white. This is advantageous to prevent variations in color and achieve the high-quality emission of light (see JP-A 2000-77723 which corresponds to U.S. Pat. No. 5,959,316).

In recent years, the demand for the so-called white LED lamp has increased as a tendency for its use in a portable lighting device, for example, has grown, and accordingly requires a larger power. Therefore, upsizing the LED chip and increasing the drive power are promoted. Thus, the density of the blue light, which impinges on and excites the fluorescent material in the second layer, has tended to be further improved.

The fluorescent material can not convert all the impinged blue light into yellow light, but has the tendency to lower the wavelength conversion efficiency as the density of the impinging light increases. The remaining energy not converted into a certain color is turned into heat. In this case, the fluorescent material has a general temperature characteristic that lowers the wavelength conversion efficiency in higher temperatures.

In the LED lamp with the conventional structure as disclosed in JP-A 2000-77723, upsizing the LED chip and increasing the drive power supplied to the LED chip are performed to increase the density of the light beam from the LED chip that impinges on the fluorescent. As the density of the light beam is increased, in other words, the power consumed in the LED chip is increased, the amount of light may saturate and therefore become phenomenally lower. In addition, generation of heat can not be neglected when a number of LED lamps are employed.

SUMMARY OF THE INVENTION

In accordance with an aspect of the invention, a semiconductor light emitting device can include a base having a cavity provided for housing an LED chip and a resin spacer therein. The resin spacer can include at least two layers of spacers including a transparent resin spacer and a wavelength conversion spacer mixed with a fluorescent material and formed with an almost constant thickness. The wavelength conversion spacer can include and/or contain a metallic radiation mesh or radiation wire disposed therein which can prevent elevation of the temperature at the fluorescent material in the wavelength conversion spacer. The radiation mesh or radiation wire can prevent elevation of the temperature at the fluorescent material in the wavelength conversion spacer.

In accordance with another aspect of the invention, the radiation mesh or radiation wire (that can be composed of a metal that is excellent in heat radiation) can be disposed in the wavelength conversion spacer. As described above, when excited by light with a different wavelength, all light can not be converted into a desired wavelength. This conversion energy that is turned into heat can be diffused uniformly in the fluorescent material through the radiation mesh or radiation wire. This is effective to prevent the phenomenon in which conversion efficiency is lowered, for example, and prevents bringing part of the fluorescent material to a high temperature.

In accordance with another aspect of the invention, a semiconductor light emitting device can include a base having a cavity provided therein and an LED chip located adjacent the base. A transparent layer can be located adjacent the base, and a wavelength conversion layer can be located adjacent the transparent layer and include a fluorescent material. One of a metallic radiation mesh and a radiation wire can be located adjacent the cavity of the base.

In accordance with another aspect of the invention, a method of forming a semiconductor light emitting device can include providing a base having a cavity provided therein, an LED chip located adjacent the base, a resin spacer located adjacent the base, the resin spacer including at least two layers, including, a transparent resin spacer, and a wavelength conversion spacer including a fluorescent material and having a substantially constant thickness, wherein the wavelength conversion spacer includes one of a metallic radiation mesh and a radiation wire. The method can also include connecting the one of the metallic radiation mesh and radiation wire adjacent to the cavity of the base.

Thus, the wavelength conversion spacer can be retained at almost the same temperature overall. If a part of this spacer is brought to a high temperature, that part lowers the conversion efficiency to cause a partially dark portion that leads to the so-called color variation. Such color variation worsens the appearance of the semiconductor light emitting device, which is one of the various problems in the art. In addition, a part of the generated heat can be radiated through the radiation mesh to the base. This is effective to lower the temperature at the fluorescent material and prevent a reduction in conversion efficiency.

BRIEF DESCRIPTION OF THE DRAWINGS

These and other features and advantages of the invention will become clear from the following description with reference to the accompanying drawings, wherein.

DETAILED DESCRIPTION OF PREFERRED EMBODIMENTS

Figure 1:
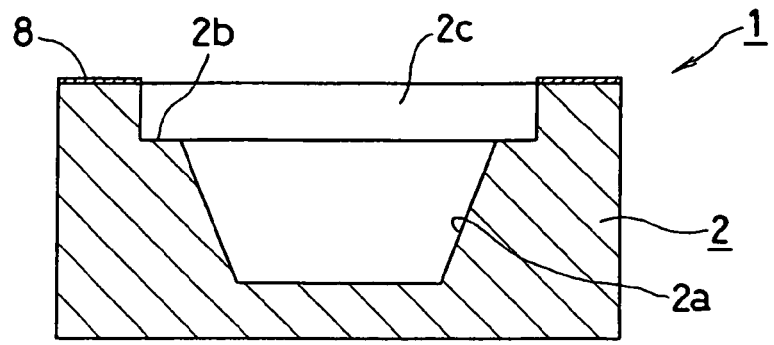
FIG. 1 is a cross-sectional view showing a base of a semiconductor light emitting device made in accordance with the principles of the invention.

The invention will now be described in detail based on the exemplary embodiments shown in the drawings. In these figures, identical or similar members are labeled using the same symbols, and in some cases, descriptions of these common members are omitted. Although the following embodiments are exemplary of the invention, the invention is in no way limited to the embodiments presented below.

Figure 2:
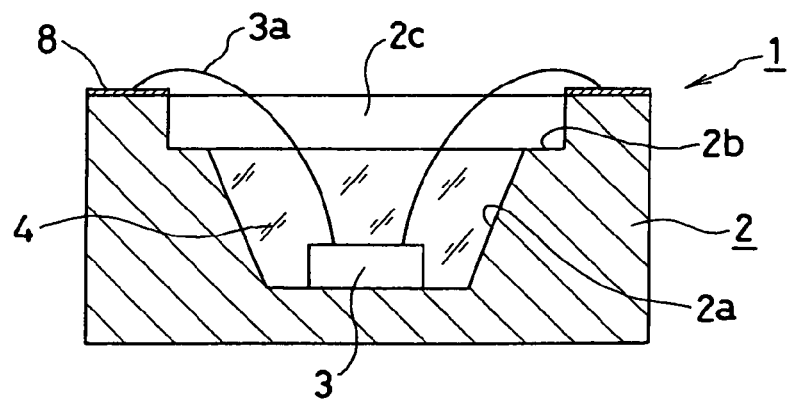
FIG. 2 is an illustrative view showing the attaching of an LED chip and a transparent resin spacer to the base in a semiconductor light emitting device made in accordance with the principles of the invention.

FIGS. 1-2 show a base 2, which can be employed to form a semiconductor light emitting device 1 made in accordance with the principles of the invention. A first cavity 2a can be formed as a substantially conical recess in the base 2. An LED chip 3 such as a blue light emitting source can be die-mounted in the cavity, and a transparent resin spacer 4 can be filled therein and can have a goal of providing humidity protection around the LED chip 3.

A second cavity 2c can be formed above the first cavity 2a. The second cavity 2c can have a larger diameter than the maximum diameter of the first cavity 2a so that a step 2b is formed between the second cavity 2c and the first cavity 2a. The second cavity 2c can have an appropriate depth and can be formed as a recessed opening that is concentric with the first cavity 2a. The base 2 may be composed of a metal that is excellent in thermal conduction to quickly dissipate heat from the LED chip 3 attached thereto. A pad 8 can be provided adjacent the base 2 at an appropriate portion for wiring 3a of a gold wire, for example, to the LED chip 3, though it may not be depicted in part of the embodiments.

FIG. 2 depicts the attaching of the LED chip 3 and a transparent resin spacer 4 to the first cavity 2a in an embodiment that is constructed in accordance with the principles of the invention. First, the LED chip 3 can be die-mounted on the bottom of the first cavity 2a formed in the base 2, followed by appropriate wiring 3a of a gold wire, for example. Then, the transparent resin spacer 4 can be injected into the first cavity 2a to fill it therewith and can be cured by an appropriate process, such as heating. In this case, the step 2b may not be covered by the transparent resin spacer 4 to keep a surface of the base 2 exposed.

Figure 3:
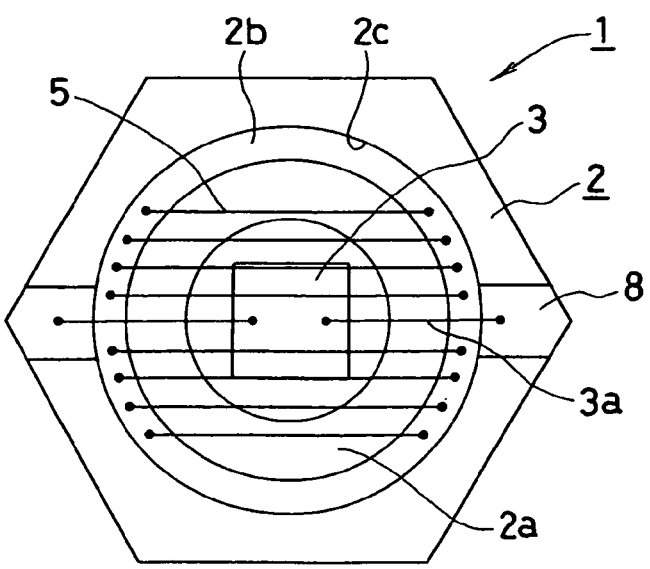
FIG. 3 is an illustrative view showing the attaching of radiation wires in the embodiment of FIG. 1.

FIG. 3 shows a plurality of radiation wires 5 arranged in parallel along the surface of the transparent resin spacer 4 that is injected as described above. In this case, a plurality of wires, such as gold wires, copper wires, aluminum wires, etc., can be attached as the radiation wires 5 by appropriate means such as wire bonding using the step 2b. If the radiation wire 5 is composed of gold or copper, the color differs from white, which is the color of light emitted from the semiconductor light emitting device 1. Accordingly, evaporation of aluminum onto the wires 5 may be applied to make the color close to white.

Figure 4:
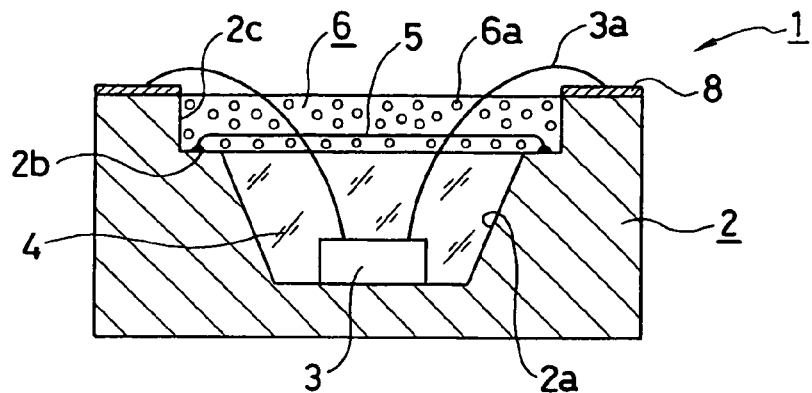
FIG. 4 is an illustrative view showing the attaching of a wavelength conversion spacer in the embodiment of FIG. 1.

In this case, the radiation wires 5 may be attached along the surface of the transparent resin spacer 4 and crossed vertically and laterally. The radiation wires 5 can be brought at both ends into intimate contact with the base 2 to conduct heat to the base 2, and they may be attached only in one direction as shown in FIG. 3, expecting an appropriate effect. In addition, a wavelength conversion spacer 6 can be attached to cover the transparent resin spacer 4 and the radiation wires 5, as shown in FIG. 4. The wavelength conversion spacer 6 can include a fluorescent material 6a as the major element that emits a yellow light when excited by a blue light.

In this case, the wavelength conversion spacer 6 can include an appropriate resin and binder mixed in the fluorescent material 6a and can initially have an appropriate viscosity. It is convenient if heating after attachment, or drooping by gravitation, can make the radiation wires 5 embed into the wavelength conversion spacer 6. Further, it is also convenient if the curing is performed after the heating or the drooping time elapses.

Thus, it is possible to prevent elevation of the temperature of the fluorescent material 6a inside the wavelength conversion spacer 6. The presence of opaque radiation wires 5 in the transparent resin spacer 4 or in the wavelength conversion spacer 6, however, may result in portions that possibly block light that is to be transmitted therethrough and may be viewed as so-called shadows.

In a prototype produced by the Inventor, the fluorescent material 6a inside the wavelength conversion spacer 6 was in the form of particles and itself emitted light by excitation. Accordingly, the light from the wavelength conversion spacer 6 containing the fluorescent material 6a, or a set of the particles, layered therein, can be almost completely diffused light. Therefore, the radiation wires 5 do not produce the so-called shadows if the fluorescent material is employed by a sufficient amount to yield a white light when mixed with the blue light from the LED chip and provided the radiation wires 5 are arranged in the vicinity of the surface of the wavelength conversion spacer 6 in an inappropriate arrangement.

Figure 5:
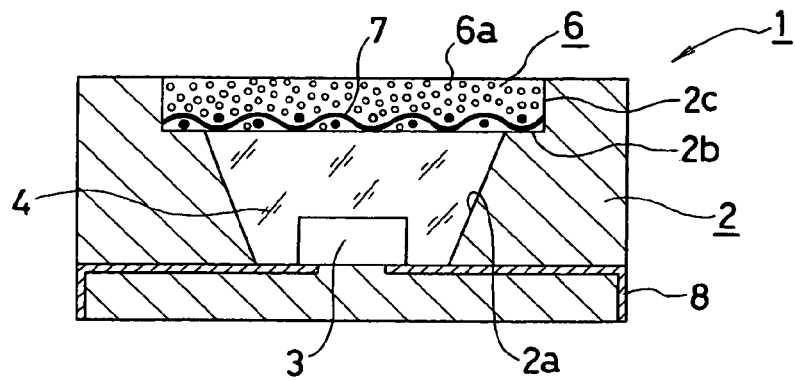
FIG. 5 is a cross-sectional view showing another embodiment of the semiconductor light emitting device made in accordance with the principles of the invention.

FIG. 5 shows another embodiment of a semiconductor light emitting device that is made in accordance with the principles of the invention. The embodiment of FIG. 5 can also employ the base 2, which can be shaped similar to the embodiment of FIG. 1, and can be provided with the first cavity 2a, the step 2b and the second cavity 2c. In this case, however, a radiation mesh 7 previously formed in an almost circular mesh can be attached to the step 2b as will be described later. Accordingly, wires for supplying power to the LED chip 3 may have difficulty in wiring via a portion located at the step 2b. Therefore, the pad 8 can be provided on the bottom in the base 2.

Also in the embodiment of FIG. 5, the procedure of forming the semiconductor light emitting device 1 can be almost similar to that of the embodiment of FIG. 1. The LED chip 3 can be die-mounted on the bottom in the first cavity 2a of the base 2 and the transparent resin spacer 4 can be injected around the chip.

In this case, the amount of the transparent resin spacer 4 injected can be controlled to expose the step 2b similar to the preceding embodiment. Thus, appropriate processes, such as spot welding, enables the radiation mesh 7 to be attached covering the upper portion of the first cavity 2a. In addition, the radiation mesh 7 can have an increased area of contact with the base 2, which provides excellent thermal conduction between both structures.

The wavelength conversion spacer 6 formed with an appropriate amount of the fluorescent material can be attached for covering the radiation mesh 7 by an injection process, and then cured by heating, and finally fixed at a certain location. In this case, the wavelength conversion spacer 6 may be designed such that it can enter the radiation mesh 7 when it is softened by heating before curing. Alternatively, it may be designed to have an appropriate initial viscosity and be operable to droop by gravitation and thus enter the grids of the radiation mesh 7 by the force of gravity or other pulling force.

The radiation mesh 7 may be formed through a process of photo-etching with a photoresist that can achieve a very high precision, which has been employed on production of patterns for semiconductors in recent years. Alternatively, it may be formed through a process of micro electro mechanical systems that can similarly achieve a high precision.

The radiation wire 5 or the radiation mesh 7 can be buried in the wavelength conversion spacer 6 as described above. In addition, the radiation wire 5 or the radiation mesh 7 can be partly connected to the base 2. Thus, the heat generated by excitation and light emission can be conducted for cooling through the radiation mesh 7 to the base 2, which can be selected to have a larger heat capacity and to easily radiate heat. The fluorescent material may lower the emission efficiency as the temperature rises. This problem can be addressed, as shown in FIG. 6.

Figure 6:
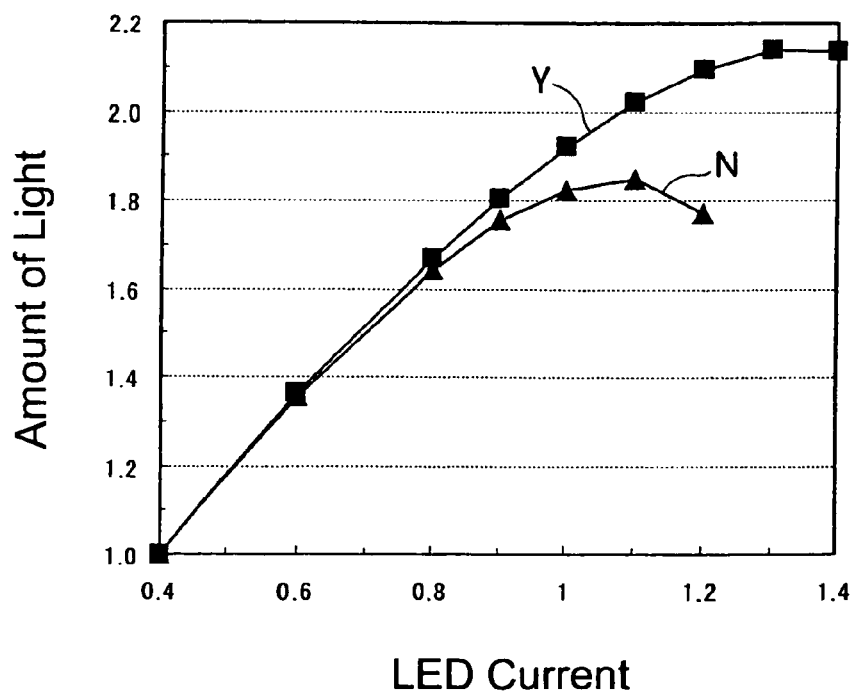
FIG. 6 is a graph showing a difference found in the amount of light relative to the drive power when the semiconductor light emitting device provided with the radiation mesh (or radiation wire) made in accordance with the principles of the invention is compared with a semiconductor light emitting device of the related art.

As shown with curve N in FIG. 6, if no radiation wire 5 is provided in the wavelength conversion spacer 6, the brightness (the amount of light) initially increases almost in proportion to the intensity of the drive current supplied to the LED chip 3. In contrast, the increase in the amount of light may not be proportional to the increase in the drive current as the drive current exceeds 80%, and a remarkable tendency appears in that there is a reduction in the amount of light.

A strong tendency for saturation of the amount of light occurs when the drive current is in a range between 100-110%. A tendency for a reduction in the amount of light can be found if the drive current exceeds 120%. In this case, when a wavelength conversion spacer 6 is viewed, the center may be obviously observed as being dark due to excessive elevation of the temperature in that location. Thus, it can be identified that variations in light emission are caused in the wavelength conversion spacer 6 as a whole.

On the other hand, as shown with curve Y in FIG. 6, in the semiconductor light emitting device 1 with the radiation wire 5 or the radiation mesh 7 provided inside the wavelength conversion spacer 6, the amount of light can rise almost in proportion to the drive current when it is below about 120%. Within a range of the drive current between 130-140%, the amount of light exhibits a tendency of saturation, but a tendency for reduction in the amount of light has not appeared yet. Accordingly, substantially no variation in light emission can be caused in the wavelength conversion spacer 6.

As described above, in a semiconductor light emitting device 1 that is made in accordance with the principles of the invention, which includes almost the same base 2, almost the same LED chip 3 and almost the same wavelength conversion spacer 4, only the radiation mesh 7 (or the radiation wire 5) may be added. This addition is effective to intensively dissipate the heat from the wavelength conversion spacer 6. In addition, the increase in the amount of light can proportionally follow the drive power even if it is supplied at about 120-130% larger than when the radiation mesh or wire is not added. Therefore, it is possible to achieve a semiconductor light emitting device 1 having the same size and capable of emitting an about 20% higher amount of light.

In this case, the radiation mesh 7 can retain lower and uniform temperatures over the entire surface of the wavelength conversion spacer 6. Therefore, it is possible to prevent variations in light from arising on the light emission surface and improve the quality of the semiconductor light emitting device 1.

While there has been described what are at present considered to be preferred embodiments of the invention, it will be understood that various modifications may be made thereto, and it is intended that the appended claims cover all such modifications as fall within the true spirit and scope of the invention. For example, the specific method or structures for attaching the various structures and components of the light emitting device can be different from those described above and fall within the scope of the invention. In addition, the specific shape and orientations of the structures, components and cavities can vary in accordance with particular applications and desires and still fall within the scope and spirit of the invention.

What is claimed is:

1. A semiconductor light emitting device, comprising:
   a base having a cavity provided therein;
   an LED chip located adjacent the base;
   a spacer located adjacent the base, the spacer including at least two layers in the cavity, including
      a transparent resin spacer in a first portion of the cavity, and
      a wavelength conversion spacer in a second portion of the cavity and including a fluorescent material and having a substantially constant thickness, wherein the wavelength conversion spacer includes one of a metallic radiation mesh and a radiation wire.

2. The semiconductor light emitting device according to claim 1, wherein the one of the radiation mesh and radiation wire has a portion mechanically connected to the base.

3. The semiconductor light emitting device according to claim 1, wherein the one of the radiation mesh and radiation wire is composed of any one of gold, aluminum and copper.

4. The semiconductor light emitting device according to claim 1, wherein the fluorescent material is mixed within resin of the wavelength conversion spacer.

5. The semiconductor light emitting device according to claim 1, wherein the one of the radiation mesh and radiation wire is disposed in the wavelength conversion spacer.

6. The semiconductor light emitting device according to claim 1, further comprising:
   a wiring pad located on a top surface of the base.

7. The semiconductor light emitting device according to claim 1, further comprising:
   a wiring pad located at a bottom portion of the base.

8. The semiconductor light emitting device according to claim 7, wherein the wiring pad is located under the LED chip.

9. The semiconductor device according to claim 1, wherein the transparent resin spacer is disposed between the LED chip and the wavelength conversion spacer.

10. A semiconductor light emitting device, comprising:
    a base having a cavity provided therein;
    an LED chip located adjacent the base;
    a transparent layer located adjacent the base,
    a wavelength conversion layer located adjacent the transparent layer and including a fluorescent material,
    a step formed between the transparent layer and the wavelength conversion layer, and one of a metallic radiation mesh and a radiation wire spanning the cavity of the base.

11. The semiconductor light emitting device according to claim 10, wherein the one of the radiation mesh and radiation wire has a portion mechanically connected to the base.

12. The semiconductor light emitting device according to claim 10, wherein the one of the radiation mesh and radiation wire is composed of any one of gold, aluminum and copper.

13. The semiconductor light emitting device according to claim 10, wherein the one of the radiation mesh and radiation wire is disposed in the wavelength conversion spacer.

14. A semiconductor light emitting device, comprising:
a base having a first cavity provided therein, the first cavity having a first depth and a diameter that varies continuously along the first depth between a minimum diameter and a maximum diameter;
an LED chip located adjacent the base in the first cavity;
a second cavity formed above the first cavity, the second cavity having a second depth and a substantially constant diameter as measured along the second depth where the substantially constant diameter is greater than each of the minimum diameter and the maximum diameter;
a spacer located adjacent the base, the spacer including at least two layers, including
a transparent resin spacer formed within the first cavity, and
a wavelength conversion spacer formed within the second cavity and including a fluorescent material and having a substantially constant thickness, wherein the wavelength conversion spacer is embedded with one of a metallic radiation mesh and a radiation wire.

15. The semiconductor device according to claim 14, wherein the one of a metallic radiation mesh and radiation wire is thermally coupled to the base.

16. The semiconductor device according to claim 14, wherein the second cavity defines a step formed between the first cavity and the second cavity.

* * * * *